US008103013B2

(12) United States Patent
Sung et al.

(10) Patent No.: US 8,103,013 B2
(45) Date of Patent: Jan. 24, 2012

(54) ACOUSTIC TRANSDUCER DEVICE

(75) Inventors: Po-Hsun Sung, Taichung (TW); Hong-Ching Her, Taichung (TW)

(73) Assignee: Merry Electronics Co., Ltd., Taichung (TW)

( * ) Notice: Subject to any disclaimer, the term of this patent is extended or adjusted under 35 U.S.C. 154(b) by 534 days.

(21) Appl. No.: 12/389,114

(22) Filed: Feb. 19, 2009

(65) Prior Publication Data

US 2010/0208909 A1 Aug. 19, 2010

(51) Int. Cl.
*H03B 29/00* (2006.01)

(52) U.S. Cl. ..................... 381/71.7; 381/71.6; 381/71.8; 381/94.7; 381/317

(58) Field of Classification Search ................. 381/71.1, 381/71.6, 71.7, 71.8, 94.1, 94.7, 317
See application file for complete search history.

(56) References Cited

U.S. PATENT DOCUMENTS 5,251,262 A * 10/1993 Suzuki et al. ................ 381/71.8
6,831,984 B2 * 12/2004 Sapiejewski ................. 381/71.6
7,983,433 B2 * 7/2011 Nemirovski .................. 381/318
8,019,107 B2 * 9/2011 Ngia et al. .................... 381/338
2003/0035551 A1 * 2/2003 Light et al. .................. 381/71.6
2007/0160243 A1 * 7/2007 Dijkstra et al. ............... 381/317
2008/0226091 A1 * 9/2008 Matsumoto et al. ......... 381/71.1
2008/0310645 A1 * 12/2008 Itabashi et al. ............... 381/71.6
2009/0147966 A1 * 6/2009 McIntosh et al. .......... 381/71.11
2009/0190771 A1 * 7/2009 Sung ............................ 381/71.6
2010/0119094 A1 * 5/2010 Sjursen et al. ................ 381/323
2010/0208909 A1 * 8/2010 Sung et al. ................... 381/71.6
2010/0215198 A1 * 8/2010 Ngia et al. .................... 381/309

* cited by examiner

*Primary Examiner* — David S. Warren
(74) *Attorney, Agent, or Firm* — Muncy, Geissler, Olds & Lowe, PLLC

(57) ABSTRACT

An acoustic transducer device is provided. The device includes a body, a speaker, a microphone, and a processor. The body has a cavity, a sound exit, and a sound entrance. The cavity interflows with the sound exit and accommodates the speaker. The microphone is disposed within the body beside the speaker. The microphone interflows selectively with the cavity or the sound entrance. The processor is electrically connected to the speaker and the microphone. When the microphone interflows with the cavity, the microphone receives a sound signal generated from the cavity and transmits the sound signal to the processor for cancelling noise in the cavity. When the microphone interflows with the sound exit, the microphone receives an external sound signal and transmits the external sound signal to the processor for cancelling noise from the external.

14 Claims, 6 Drawing Sheets

ACOUSTIC TRANSDUCER DEVICE

BACKGROUND OF THE INVENTION

1. Field of Invention

The present invention relates to an acoustic transducer device for noise processing, and more particularly to an acoustic transducer device for noise processing capable of switching between a feed-forward noise cancellation mode and a feed-back noise cancellation mode.

2. Related Art

People are apt to be fretful when they are affected by noises. If a person has been under a noisy environment for a long time, a permanent hearing impairment may even be caused. Therefore, in recent years, technologies for cancelling noise are continuously proposed. In the field of earphones, early noise cancellation technology is based on structural improvements. For example, ear covers or ear muffs with a good sound isolation effect are selected. Generally, such earphones are capable of isolating noises above 800 Hz, but have a poor sound isolation effect against noises below 800 Hz, especially low frequency noises. Hence, such a technology that is commonly called "passive noise cancellation" cannot perfectly solve the noise problem completely. For this reason, an electronic noise cancellation technology called "active noise cancellation" is frequently proposed recently in order to eliminate the deficiencies of "passive noise cancellation". The "active noise cancellation" technology may be classified into the following two types: feed-forward noise cancellation technology and feed-back noise cancellation technology.

FIG. 1A is a schematic structural view of a feed-forward noise cancellation earphone 1. Referring to FIG. 1A, the earphone 1 is provided with a microphone 10, a noise cancellation circuit 11, and a speaker 12. The speaker 12 faces the ear canal of a user. After the microphone 10 receives an external noise, the noise cancellation circuit 11 generates an anti-noise signal to cancel the noise received in the earphone 1. The advantage of this implementation lies in that, the microphone 10 receives only the noise and does not receive any sound output by the speaker 12, so that an open-loop system is formed, and no closed-loop oscillation or echo will be caused. Thus, the circuit may be adjusted to the best noise cancellation effect independently. However, since the noise undergoes a plurality of reflections when passing through ears of a user and the amplitude and phase of the noise have changed, the noise received by the microphone 10 is quite different from that within the ears of the user. Moreover, since the external noise is highly directional, it is difficult to meet noise cancellation requirements against noises from different directions by using a single circuit.

FIG. 1B is a schematic structural view of a feed-back noise cancellation earphone 2. Referring to FIG. 1B, the earphone 2 is also provided with a microphone 20, a noise cancellation circuit 21, and a speaker 22. The speaker 22 faces the ear canal of a user. The microphone 20 is disposed between the speaker 22 and the ear canal, so that the noise received from the ear by the microphone 20 is the same as that heard by the user. After the noise is filtered, amplified, and inverted in phase by the noise cancellation circuit 21, the speaker 22 is driven to produce a sound. In such a closed-loop system design, the microphone 20 is insensitive to the direction of the noise, and a sound with a high signal-to-noise ratio may be generated after a feedback signal and a sound signal are superposed, so the noise is the lowest when transmitted to and heard by the ear of the user. Although the feed-back noise cancellation earphone has a good noise cancellation effect, resonance attenuation occurs in a high frequency range. As a result, for users that usually use the earphone to listen to music, the earphone with the noise cancellation function undesirably compromises the effect of the original sound output, and thus fails to achieve a desirable performance.

SUMMARY OF THE INVENTION

Accordingly, the present invention is directed to an acoustic transducer device integrating a feed-forward noise cancellation technology and a feed-back noise cancellation technology, so as to achieve the advantages of both two different noise cancellation technologies.

In order to achieve the above objective, an acoustic transducer device is provided, which includes a body, a speaker, a microphone, and a processor. The body has a cavity, a sound exit, and a sound entrance. The cavity is in communication with the sound exit. The speaker is disposed within the cavity and outputs a generated sound signal to an exterior via the sound exit. The microphone is disposed within the body adjacent to the speaker, and is selectively in communication with the cavity or the sound entrance. The processor is electrically connected to both the speaker and the microphone. When the microphone is in communication with the cavity, the microphone receives a sound signal within the cavity and transmits the sound signal to the processor, and the processor outputs an anti-signal to the speaker for the sound signal that is defined as a noise. In contrast, when the microphone is in communication with the sound entrance but is not in communication with the cavity, the microphone receives an external sound signal and transmits the external sound signal to the processor, and the processor outputs an anti-signal to the speaker for the sound signal that is defined as a noise.

The microphone of the acoustic transducer device of the present invention is selectively in communication with the cavity to receive the sound signal therein or in communication with the exterior to receive the external sound signal, so as to form a feed-forward noise cancellation mode together with the processor when receiving the external sound signal, and form a feed-back noise cancellation mode together with the processor when receiving the sound signal in the cavity. In comparison with the prior art, both manufacturers and customers can determine whether to switch the acoustic transducer device to the feed-forward mode or the feed-back mode according to a desired sound performance in manufacturing or use.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

An acoustic transducer device according to a preferred embodiment of the present invention is described below with reference to the accompanying drawings.

Figure 1A:
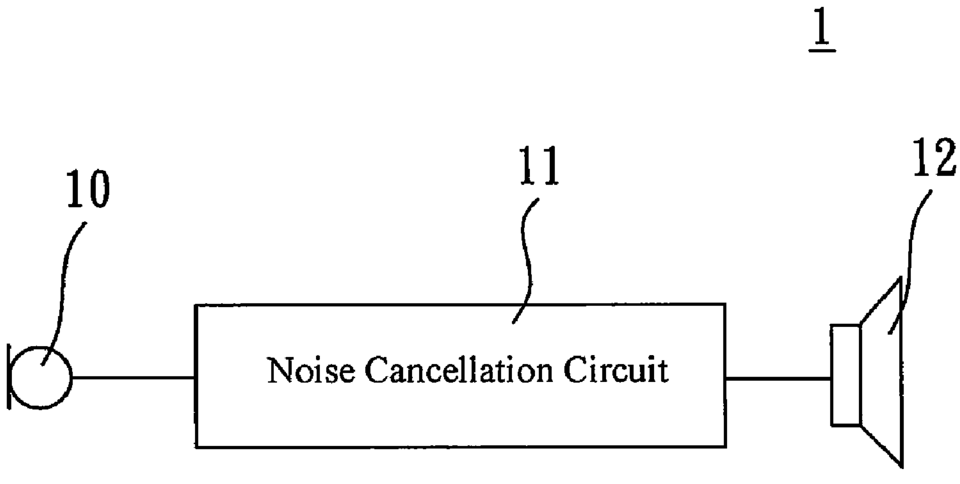
FIG. 1A is a schematic cross-sectional view of a first preferred embodiment of the present invention.
Figure 1B:
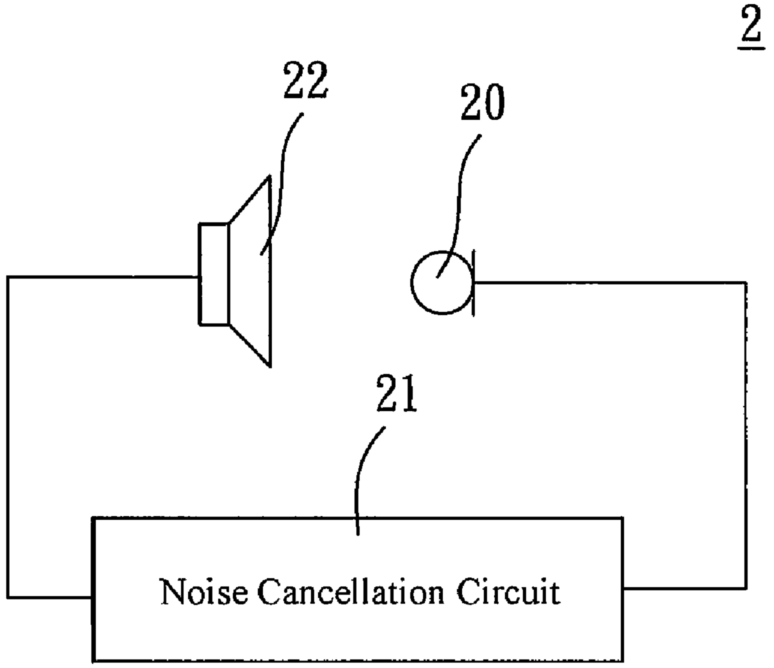
FIG. 1B is a schematic cross-sectional view of a second preferred embodiment of the present invention.
Figure 2:
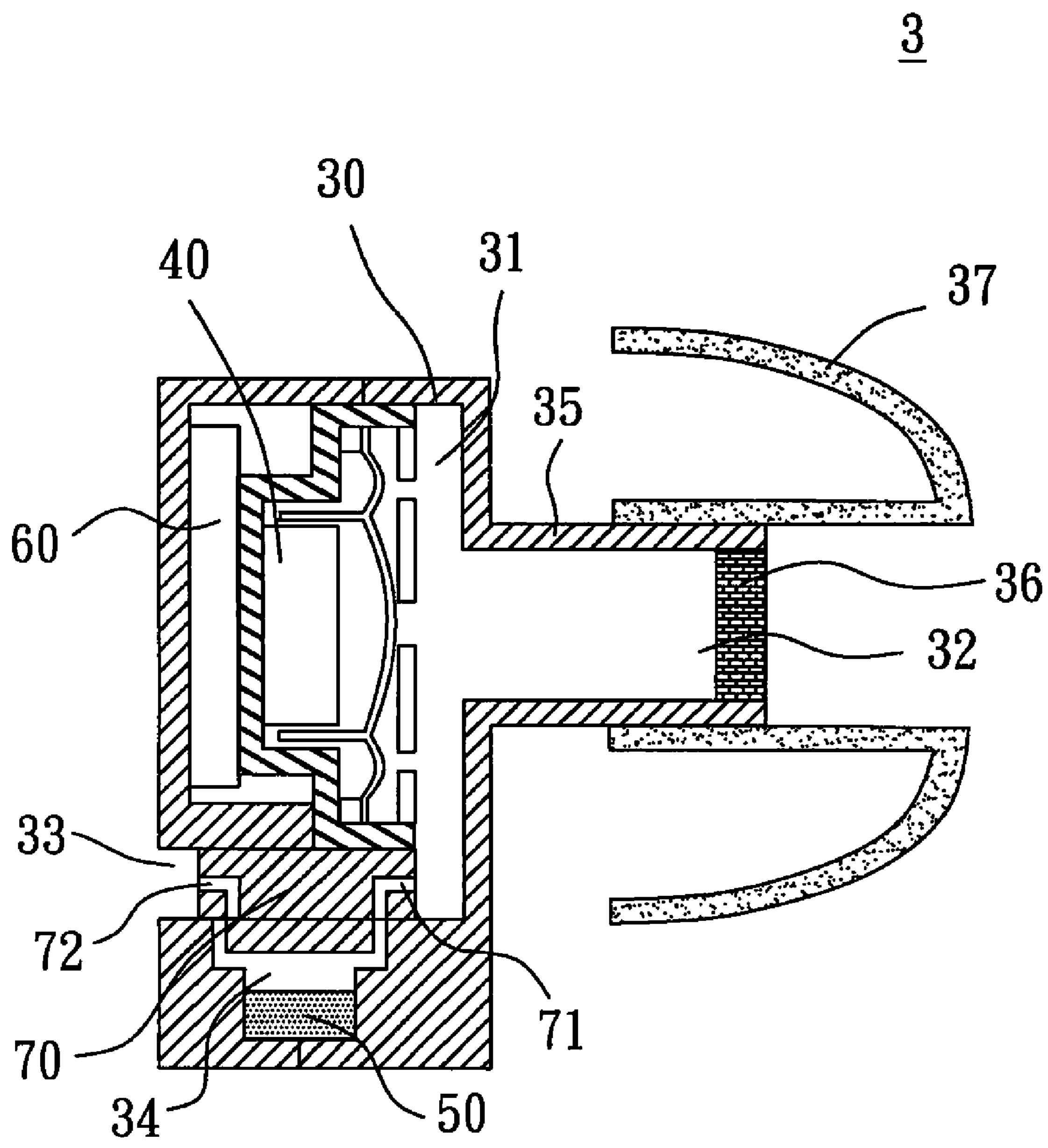
FIG. 2 is a schematic cross-sectional view of an acoustic transducer device according to a first embodiment of the present invention.

FIG. 2 is a schematic cross-sectional view of an acoustic transducer device according to a first embodiment of the present invention. Referring to FIG. 2, the acoustic transducer device 3 may be an earphone, which includes a body 30, a speaker 40, a microphone 50, and a processor 60. The body 30 has a cavity 31, a sound exit 32, and a sound entrance 33. The cavity 31 is in communication with the sound exit 32. The speaker 40 is disposed within the cavity 31. The microphone 50 is disposed within an accommodating space 34 of the body 30 adjacent to the speaker 40 and selectively in communication with the cavity 31 or the sound entrance 33. The processor 60 is electrically connected to the speaker 40 and the microphone 50.

When the microphone 50 is in communication with the cavity 31, the microphone 50 receives a sound signal within the cavity 31 and transmits the sound signal to the processor 60, and the processor 60 outputs an anti-signal to the speaker 40 for the sound signal that is defined as a noise. In contrast, when the microphone 50 is in communication with the sound entrance 33 and is not in communication with the cavity 31, the microphone 50 receives an external sound signal and transmits the external sound signal to the processor 60, and the processor 60 outputs an anti-signal to the speaker 40 for the sound signal that is defined as a noise.

Moreover, the body 30 also has a sound tube 35. One end of the sound tube 35 is in communication with the cavity 31, and the other end of the sound tube 35 is the sound exit 32. A damping 36 is disposed at the sound exit 32 of the sound tube 35 to block the sand and dust. An ear plug 37 is sleeved outside of the sound tube 35. The ear plug 37 is made of an elastic plastic. As such, a user can conveniently wear the acoustic transducer device 3 by plugging the ear plug 37 into the ear canal.

In addition, in this embodiment, a switch 70 disposed between the cavity 31 and the sound entrance 33 is used to control the microphone 50 to be selectively in communication with the cavity 31 or the sound entrance 33. A first passage 71 and a second passage 72 are formed on the switch 70. When the switch 70 is moved to a first position, the first passage 71 is in communication with the cavity 31 and the accommodating space 34, such that the microphone 50 receives the sound signal within the cavity 31. When the switch 70 is moved to a second position, the second passage 72 is in communication with the sound entrance 33 and the accommodating space 34, such that the microphone 50 receives the sound signal via the sound entrance 33.

Figure 3:
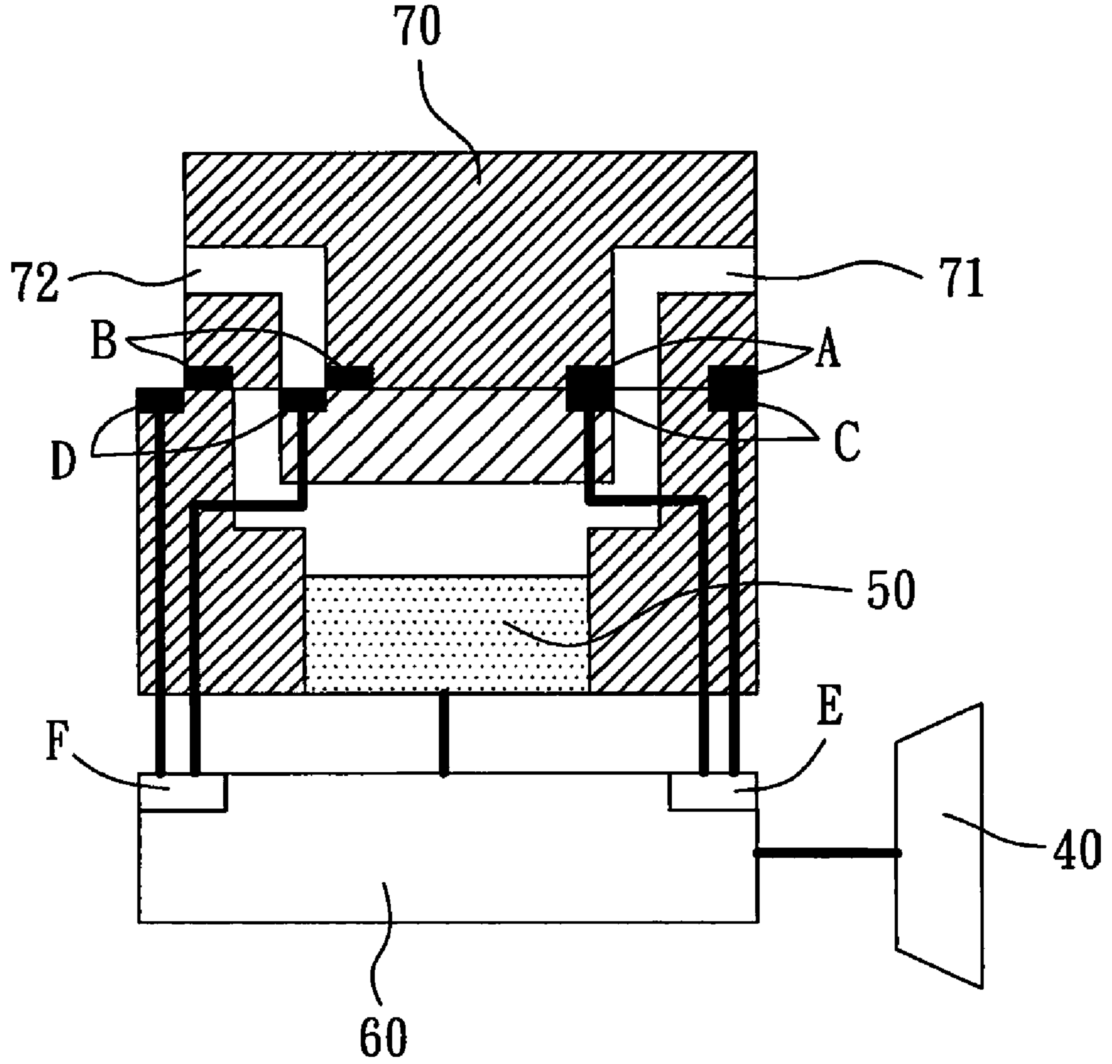
FIG. 3 is a schematic view of the acoustic transducer device according to the first embodiment of the present invention when a switch is at a first position.
Figure 4:
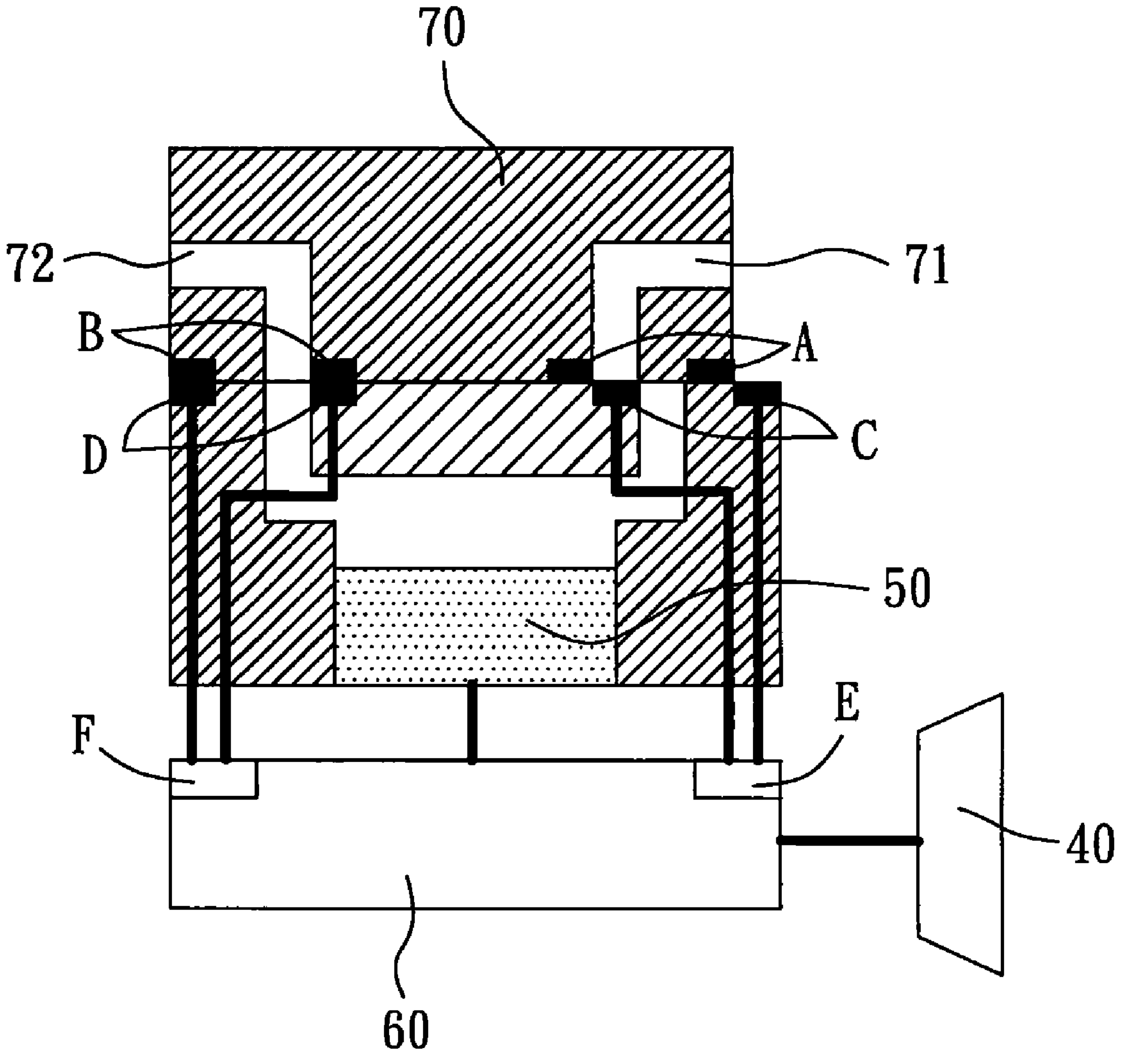
FIG. 4 is a schematic view of the acoustic transducer device according to the first embodiment of the present invention when the switch is at a second position.

FIG. 3 is a schematic view of the acoustic transducer device according to the first embodiment of the present invention when the switch is at the first position. FIG. 4 is a schematic view of the acoustic transducer device according to the first embodiment of the present invention when the switch is at the second position. Referring to FIG. 3, the switch 70 has a first contact set A having a pair of pads on two sides of the first passage 71, and has a second contact set B having a pair of pads on two sides of the second passage 72. In addition, the body 30 has a third contact set C having a pair of pads on two sides of a path communicating the accommodating space 34 with the cavity 31 corresponding to the first contact set A, and has a fourth contact set D having a pair of pads on two sides of a path communicating the accommodating space 34 with the sound entrance 33 corresponding to the second contact set B. The third contact set C is electrically connected to a fifth contact E of the processor 60. The fourth contact set D is electrically connected to a sixth contact F of the processor 60.

When the switch 70 is moved to a position where the first passage 71 is in communication with the cavity 31 and the accommodating space 34, the accommodating space 34 is not in communication with the sound entrance 33, and the microphone 50 directly receives a sound signal produced by the speaker 40 from the cavity 31. That is, the so-called "feed-back noise cancellation" in noise cancellation technologies is achieved. At this time, the first contact set A is electrically connected to the third contact set C, such that the fifth contact E of the processor 60 receives an electrical signal, which drives an internal circuit of the processor 60 to operate and thus generate an anti-sound wave for counteracting a portion of the sound signal produced by the speaker 40 that is defined as a noise, so as to cancel the noise. In contrast, as shown in FIG. 4, when the switch 70 is moved to a position where the second passage 72 is in communication with the sound entrance 33 and the accommodating space 34, the accommodating space 34 is not in communication with the cavity 31, and the microphone 50 directly receives an external sound signal. That is, the so-called "feed-forward noise cancellation" in noise cancellation technologies is achieved. At this time, the second contact set B is electrically connected to the fourth contact set D, such that the sixth contact F of the processor 60 receives another electrical signal, which drives the internal circuit of the processor 60 to operate and thus generate an anti-sound wave for counteracting a portion of the external sound signal that is defined as a noise, so as to cancel the noise.

As described above, the acoustic transducer device 3 of the present invention can be switched between the feed-forward noise cancellation mode and the feed-back noise cancellation mode by moving the switch 70, and thus can be adjusted to a required state under different sound quality requirements.

Figure 5:
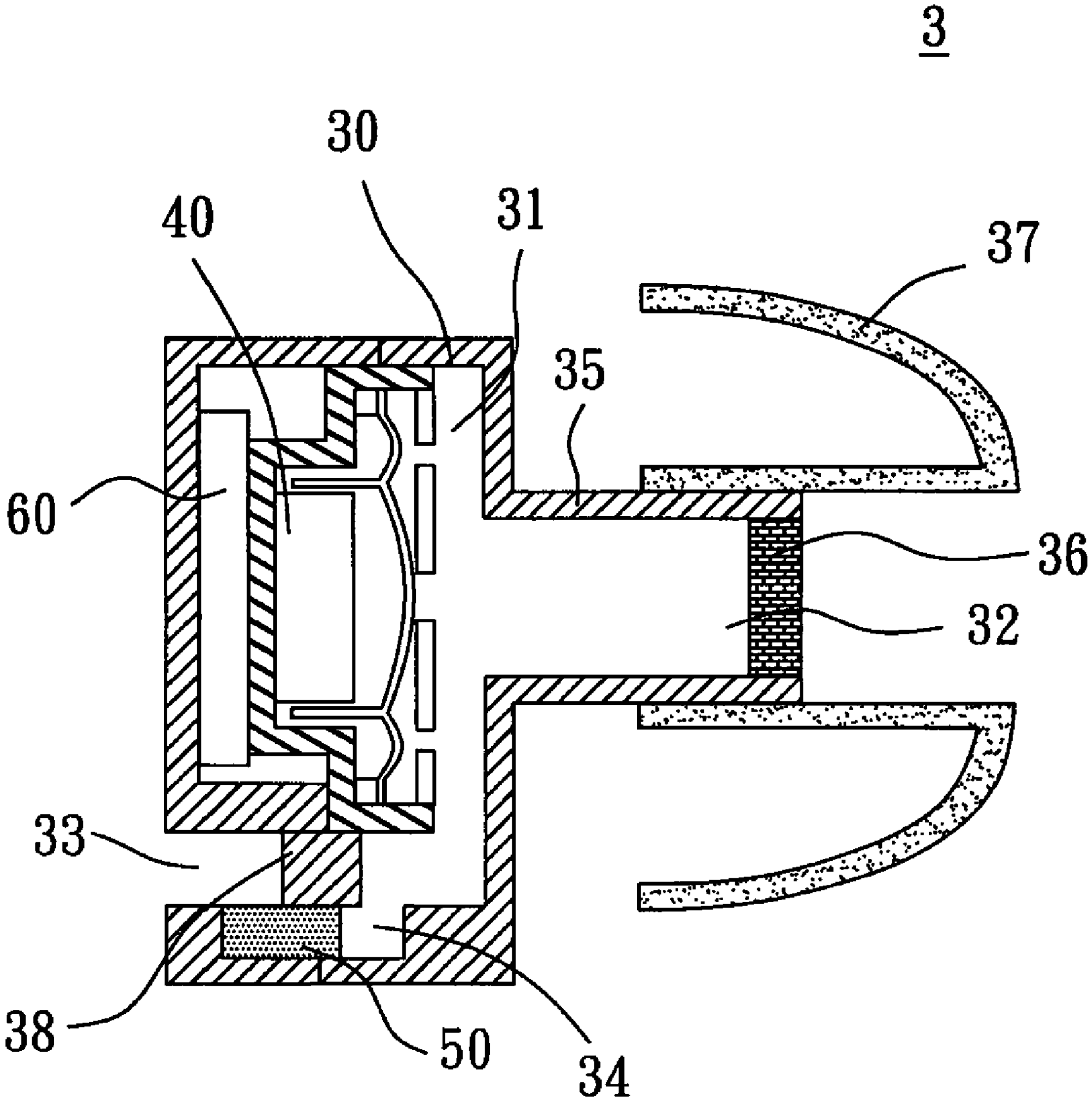
FIG. 5 is a schematic cross-sectional view of an acoustic transducer device according to a second embodiment of the present invention.

FIG. 5 is a schematic cross-sectional view of an acoustic transducer device according to a second embodiment of the present invention. The difference between this embodiment and the previous embodiment lies in that, in this embodiment, the accommodating space 34 of the body 30 is wide enough for the microphone 50 to slide therein. The body 30 is provided with a stopper 38 extending between the cavity 31 and the sound entrance 33. A sound receiving face of the microphone 50 faces upward, so that when the microphone 50 is moved to the left of the accommodating space 34 in the figure, the stopper 38 blocks the communication between the microphone 50 and the cavity 31, and the microphone 50 can only receive the external sound signal. At this time, the acoustic transducer device 3 is in a feed-forward noise cancellation mode. In contrast, when the microphone 50 is moved to the right of the accommodating space 34, the stopper 38 blocks the communication between the microphone 50 and the sound entrance 33, and the microphone 50 can only receive the sound signal within the cavity 31. At this time, the acoustic transducer device 3 is in a feed-back noise cancellation mode.

In this embodiment, the technology of switching between the feed-forward noise cancellation mode and the feed-back noise cancellation mode can be simply achieved by moving the microphone 50. However, with respect to the design for moving the microphone 50 to be electrically connected to and drive the processor 60, the designs of FIGS. 3 and 4 may be referred to, and since modifications can be easily made by those skilled in circuit design to these designs, the details will no be described herein again.

Figure 6:
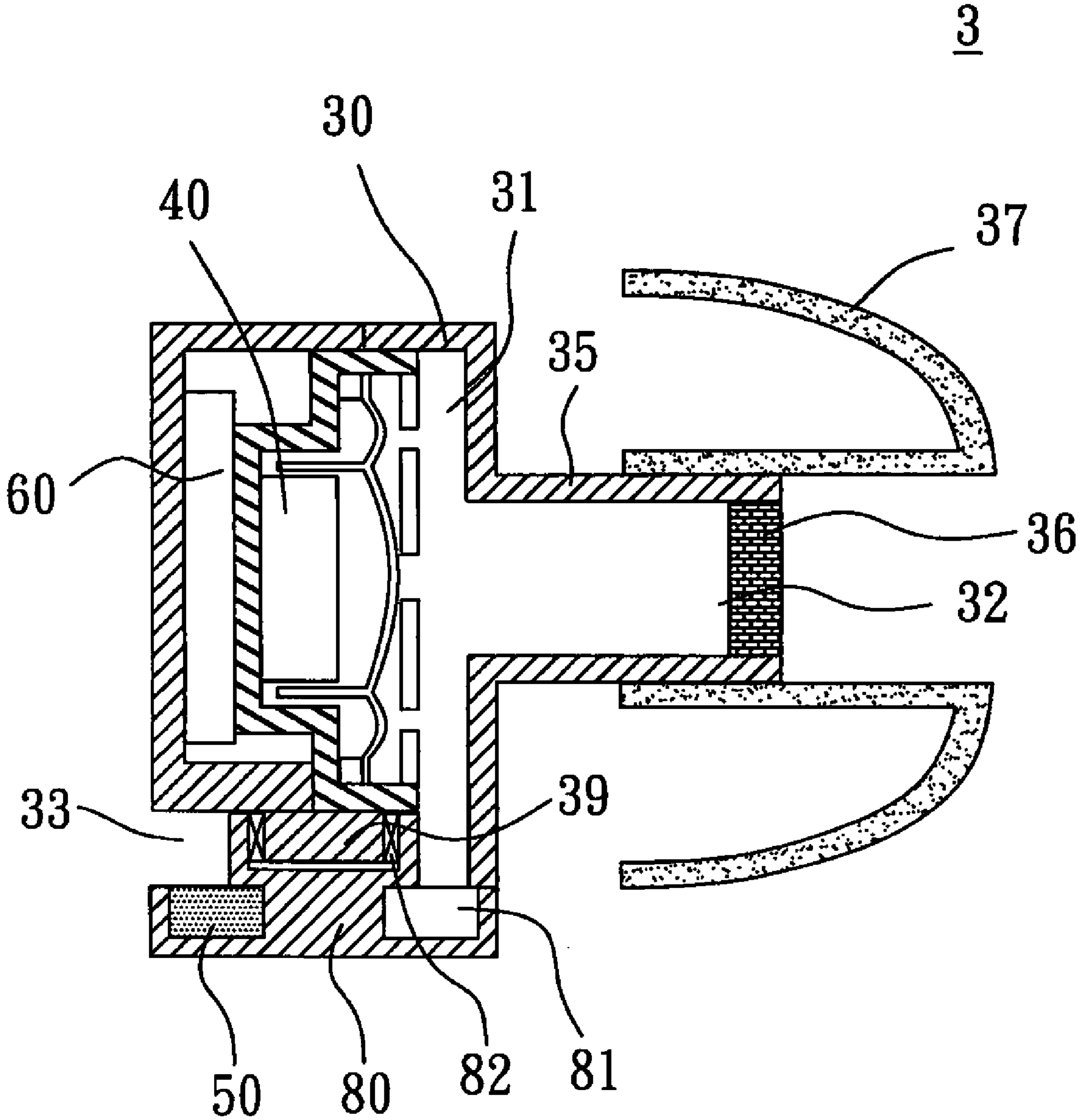
FIG. 6 is a schematic cross-sectional view of an acoustic transducer device according to a third embodiment of the present invention.

FIG. 6 is a schematic cross-sectional view of an acoustic transducer device according to a third embodiment of the present invention. The difference between this embodiment and the previous embodiments lies in that, in this embodiment, a shaft 39 extends from the body 30 for pivoting a supporting member 80. At least one groove 81 for accommodating the microphone 50 is disposed on the supporting member 80. In addition, the supporting member 80 is pivoted to the body 30 via a bearing 82.

When the supporting member 80 is rotated to the left of the shaft 39 in the figure, the microphone 50 is only in communication with the exterior and receives an external sound signal. At this time, the acoustic transducer device 3 is in a feed-forward noise cancellation mode. In contrast, when the supporting member 80 is rotated to the right of the shaft 39, the microphone 50 is only in communication with the cavity 31 and receives a sound signal in the cavity 31. At this time, the acoustic transducer device 3 is in a feed-back noise cancellation mode.

In this embodiment, the technology of switching between the feed-forward noise cancellation mode and the feed-back noise cancellation mode can be simply achieved by rotating the supporting member 80 to make the microphone 50 in communication with the exterior or the cavity 31. However, the designs of FIGS. 3 and 4 may be referred to obtain the design for moving the microphone 50 to be electrically connected to and drive the processor 60, which may be easily made by those skilled in circuit design, and will no be described in detail here.

Finally, it should be noted that, the speaker 40 in the above acoustic transducer device 3 is, for example, a dynamic speaker; however, if a balanced armature speaker is used to replace the dynamic speaker, the efficacy that can be achieved in the present invention will not be affected. In addition, the processor 60 is disposed within the body 30 closely adjacent to the speaker 40 in FIGS. 2, 5, and 6; however, the processor 60 may also be designed outside the body 30 as required, as long as the processing of the noise cancellation technology is not affected.

To sum up, the microphone of the acoustic transducer device of the present invention is selectively in communication with the cavity to receive the sound signal therein or in communication with the exterior to receive the external sound signal, so as to form a feed-forward cancelling noise mode together with the processor when receiving the external sound signal, or form a feed-back noise cancellation mode together with the processor when receiving the sound signal in the cavity. Therefore, both manufacturers and customers can determine whether to switch the acoustic transducer device to the feed-forward mode or the feed-back mode according to a desired sound performance in manufacturing or use. For example, to avoid high-frequency resonance attenuation, the acoustic transducer device may be selectively switched to the feed-forward noise cancellation mode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An acoustic transducer device, comprising:

a body having a cavity, a sound exit, and a sound entrance, wherein the cavity is in communication with the sound exit;

a speaker disposed within the cavity;

a microphone disposed within the body; and a processor electrically connected to the speaker and the microphone;

wherein when the microphone is in communication with the cavity, the microphone receives a sound signal within the cavity and transmits the sound signal to the processor, and the processor outputs an anti-signal to the speaker for the sound signal that is defined as a noise; and when the microphone is in communication with the sound entrance, the microphone receives an external sound signal and transmits the external sound signal to the processor, and the processor outputs an anti-signal to the speaker for the sound signal that is defined as a noise.

2. The acoustic transducer device according to claim 1, wherein a switch is disposed between the cavity and the sound entrance, and the microphone is controlled to be in communication with the cavity or the sound entrance by moving the switch.

3. The acoustic transducer device according to claim 2, wherein an accommodating space for accommodating the microphone is arranged in the body, when the switch is moved to a first position, a first passage of the switch is in communication with the cavity and the accommodating space, and when the switch is moved to a second position, a second passage of the switch is in communication with the sound entrance and the accommodating space.

4. The acoustic transducer device according to claim 2, wherein a first contact set and a second contact set are disposed on the switch, and a third contact set and a fourth contact set are disposed on the body, when the microphone is in communication with the cavity, the first contact set is electrically connected to the third contact set, and when the microphone is in communication with the sound entrance, the second contact set is electrically connected to the fourth contact set.

5. The acoustic transducer device according to claim 4, wherein the processor has a fifth contact and a sixth contact, the fifth contact is electrically connected to the third contact set, and the sixth contact is electrically connected to the fourth contact set, when the first contact set is electrically connected to the third contact set, the fifth contact receives an electrical signal for driving the processor, and when the second contact set is electrically connected to the fourth contact set, the sixth contact receives another electrical signal for driving the processor.

6. The acoustic transducer device according to claim 1, wherein an accommodating space for accommodating the microphone is arranged in the body, when the microphone is moved to a first position, the microphone is in communication with the cavity, and when the microphone is moved to a second position, the microphone is in communication with the sound entrance.

7. The acoustic transducer device according to claim 1, further comprising a supporting member combined with the body, wherein the microphone is disposed on the supporting member, when the supporting member is rotated to a first position relative to the body, the microphone is in communication with the cavity, and when the supporting member is rotated to a second position relative to the body, the microphone is in communication with the sound entrance.

8. The acoustic transducer device according to claim 7, wherein at least one groove for accommodating the microphone is disposed on the supporting member.

9. The acoustic transducer device according to claim 7, wherein the supporting member is pivoted to a shaft of the body via a bearing.

10. The acoustic transducer device according to claim 1, wherein the speaker is a dynamic speaker.

11. The acoustic transducer device according to claim 1, wherein the speaker is a balanced armature speaker.

12. The acoustic transducer device according to claim 1, wherein the body has a sound tube and one end of the sound tube is the sound exit.

13. The acoustic transducer device according to claim 12, wherein a damping is disposed at the sound exit of the sound tube.

14. The acoustic transducer device according to claim 12, wherein an ear plug is sleeved on the sound exit of the sound tube.

* * * * *